(12) United States Patent
Khemka et al.

(10) Patent No.: US 7,180,158 B2
(45) Date of Patent: Feb. 20, 2007

(54) SEMICONDUCTOR DEVICE AND METHOD OF MANUFACTURE

(75) Inventors: Vishnu K. Khemka, Phoenix, AZ (US); Amitava Bose, Tempe, AZ (US); Ronghua Zhu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/144,570

(22) Filed: Jun. 2, 2005

(65) Prior Publication Data
US 2006/0273428 A1 Dec. 7, 2006

(51) Int. Cl.
*H01L 27/082* (2006.01)
(52) U.S. Cl. ............. 257/565; 257/492; 257/493; 257/338; 257/155; 257/495; 438/138; 438/213
(58) Field of Classification Search ........ 257/492, 257/493, 378, 408, 409; 438/301, 197–208, 438/343, 603
See application file for complete search history.

(56) References Cited
U.S. PATENT DOCUMENTS

| | | | |
|---|---|---|---|
| 5,126,806 A | | 6/1992 | Sakurai et al. |
| 5,343,052 A | | 8/1994 | Oohata et al. |
| 5,548,133 A | * | 8/1996 | Kinzer ............. 257/155 |
| 5,920,087 A | | 7/1999 | Nakagawa et al. |
| 5,977,569 A | | 11/1999 | Li |
| 6,693,339 B1 | * | 2/2004 | Khemka et al. ........ 257/492 |
| 6,882,023 B2 | * | 4/2005 | Khemka et al. ........ 257/493 |
| 2002/0005559 A1 | | 1/2002 | Suzuki |
| 2004/0084744 A1 | | 5/2004 | Khemka et al. |

* cited by examiner

*Primary Examiner*—Andy Nuynh
*Assistant Examiner*—Tram H. Nguyen
(74) *Attorney, Agent, or Firm*—Ingrassia Fisher & Lorenz

(57) ABSTRACT

A semiconductor component and method of manufacture, including an insulated gate bipolar transistor (IGBT) (100) including a semiconductor substrate (110) having a first conductivity type and buried semiconductor region (115) having a second conductivity type located above the semiconductor substrate. The IGBT further includes a plurality of first semiconductor regions (120) having the first conductivity type, a plurality of second semiconductor regions (130) having the first conductivity type, and a plurality of third semiconductor regions (140) having the second conductivity type. A sinker region (142) having the second conductivity type is disposed in a third semiconductor region and a first semiconductor region during manufacture to define the plurality of regions and tie the buried semiconductor region to the plurality of third semiconductor regions. An emitter (150) having the first conductivity type is disposed in one of the third semiconductor regions, a collector (170) having the first conductivity type is disposed in the other of the third semiconductor regions. A field poly plate (162) is provided and tied to the collector (170). In a particular embodiment, the plurality of third semiconductor regions and the buried semiconductor region deplete the plurality of first semiconductor regions in response to a reverse bias potential applied between the plurality of second semiconductor regions and the plurality of third semiconductor regions.

5 Claims, 2 Drawing Sheets

SEMICONDUCTOR DEVICE AND METHOD OF MANUFACTURE

FIELD OF THE INVENTION

The present invention generally relates to semiconductor components, and more particularly to semiconductor transistors and methods of manufacture.

BACKGROUND OF THE INVENTION

Power devices are electronic components designed to be tolerant of the high currents and voltages that are present in power applications such as motion controlled air bag deployment and automotive fuel injector drivers. The power lateral double-diffused metal-oxide-semiconductor (LDMOS) field-effect-transistor (FET) device, referred to herein as a power LDMOS device, is becoming increasingly popular for such power applications. As power technologies develop, power applications require smaller and smaller power devices with a high breakdown voltage.

Many applications for power LDMOS devices require the inclusion of a series connected reverse diode on certain output nodes in order to realize voltage blocking capability in both positive and negative directions. When the application cannot tolerate the LDMOS body diode, such as when there is a regular output with no reverse path from the output to the input, a discrete diode in series with the LDMOS or two back-to-back LDMOS structures are used to achieve high breakdown voltage in both directions. There exists a problem with device mismatch when multiple LDMOS devices are required or an LDMOS-diode structure is required. In these types of devices a certain percentage of mismatch is expected. Insulated gate bipolar transistors (IGBTs) provide for an alternative structure.

IGBTs are designed for power applications and combine metal-oxide-semiconductor (MOS) gate control and a bipolar current flow mechanism. An IGBT incorporates features of both a metal-oxide-semiconductor field effect transistor (MOSFET) and a bipolar junction transistor (BJT). IGBTs have higher current density than MOSFETs and faster switching characteristics than BJTs. IGBTs are the primary choice today for high-power (>10 kW), low to medium frequency (up to 30 kHz) applications.

IGBT devices feature high current/high voltage operation and high input impedance at the same time. Replacing power LDMOS multi-structures with an insulated gate bipolar transistor (IGBT) provides significant savings in the required device area. That is, IGBT devices are significantly smaller than an LDMOS-diode structure or a LDMOS—LDMOS structure because the on-resistance in an IGBT is lower.

In addition, conventional LDMOS devices suffer from minority carrier current in to the substrate which can harm the surrounding devices. IGBT device structures are less susceptible to such substrate injection. IGBTs typically, do not have the same reverse recovery time associated with a standard LDMOS body diode.

Accordingly, it is desirable to provide a high voltage IGBT structure for silicon bulk based (non silicon-on-insulator (SOI)) power integrated circuits (ICs). Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals indicate like elements.

DETAILED DESCRIPTION OF THE INVENTION

Figure 1:
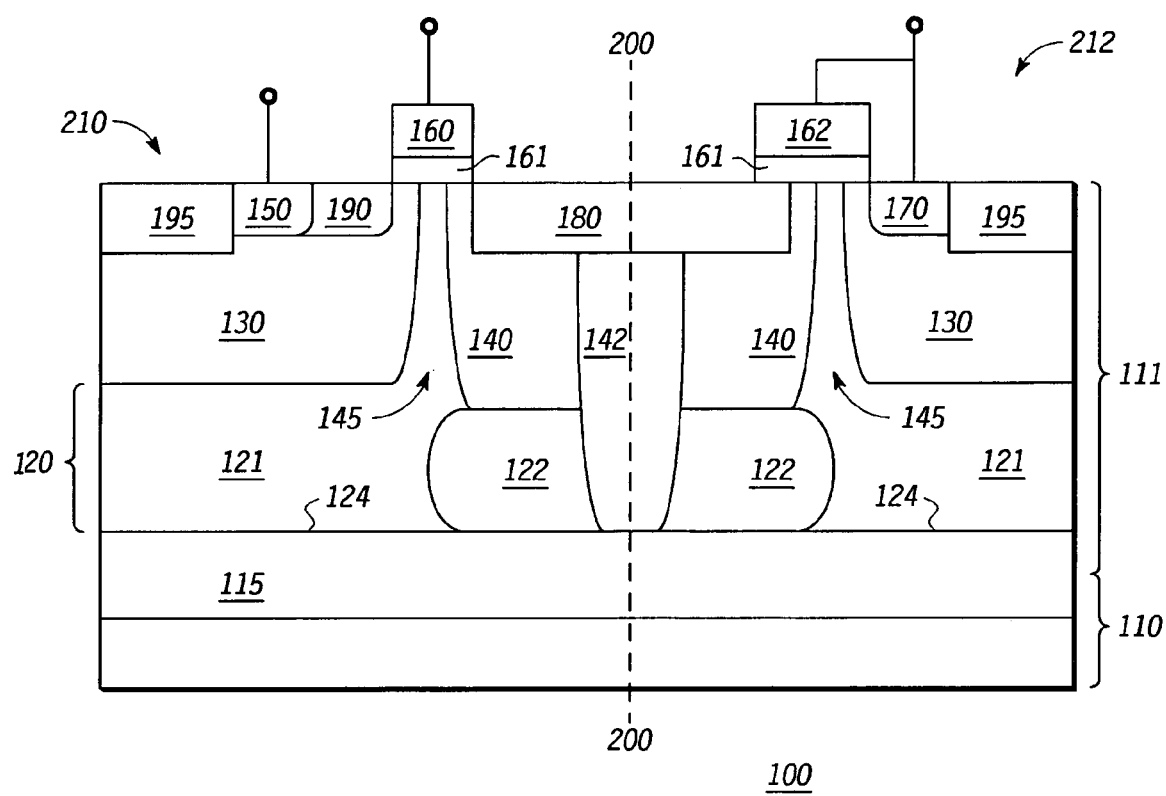
FIG. 1 is a cross-sectional view of a portion of a transistor according to an embodiment of the invention.

The following detailed description of the invention is merely exemplary in nature and is not intended to limit the invention or the application and uses of the invention. Furthermore, there is no intention to be bound by any theory presented in the preceding background of the invention or the following detailed description of the invention.

Existing technology attempts to satisfy the high breakdown voltage requirement in power devices by utilizing a power device having a reduced surface field (RESURF) structure. A power device having a RESURF structure comprises: (1) a first semiconductor region that serves as a RESURF region, having a first conductivity type; and (2) a second semiconductor region that serves as a drift region having a second conductivity type. The RESURF region depletes the drift region, thus reducing the electric field in the drift region and allowing a higher breakdown voltage for the power device. This type of RESURF structure is referred to herein as a "single RESURF" structure.

A double RESURF structure, on the other hand, comprises: (1) first and third semiconductor regions that serve as RESURF regions having a first conductivity type; and (2) a second semiconductor region that serves as a drift region having a second conductivity type. In a double RESURF structure, each of the RESURF regions depletes the drift region, thus reducing the electric field in the drift region to a greater degree than is possible with a single RESURF structure.

A floating RESURF (FRESURF) structure comprises a buried layer disposed below a RESURF region. The buried layer has the same conductivity type as the drift region and is considered floating because it is not tied to either the emitter or collector. The buried layer acts as a floating island. The presence of this layer provides a novel variation of the RESURF action and helps to increase the breakdown voltage of the device even further. Power transistors, including power LDMOS devices and IGBTs can have either a single or double RESURF structure, and if the buried layer is floating, a FRESURF structure.

An IGBT power device having a single RESURF structure comprises a RESURF transistor that includes a semiconductor substrate having a first conductivity type and a buried semiconductor region having a second conductivity type located above the semiconductor substrate. The RESURF transistor further includes a first semiconductor region having the first conductivity type located above the buried semiconductor region, a second semiconductor region having the first conductivity type located above the first semiconductor region and a third semiconductor region having the second conductivity type located above the first semiconductor region. In the single RESURF transistor, the first and the second semiconductor regions deplete the third semiconductor region, which serves as the drift region, thereby reducing the electric field in the third semiconductor region and allowing higher breakdown voltages. The buried semiconductor region is provided for the purpose of isolation and does not aid in the RESURF action.

An IGBT power device having a double RESURF structure comprises a single RESURF transistor where the buried semiconductor region and the third semiconductor region deplete the first semiconductor region, thereby reducing the electric field in the third semiconductor region to a greater degree than the single RESURF structure. An IGBT power device having a buried layer that is not tied to either the emitter of collector and is electrically floating, is referred to as a floating RESURF (FRESURF) structure.

Referring now to the drawings, FIG. 1 is a cross-sectional view of a portion of a transistor according to an embodiment of the invention. IGBT 100 is a portion of a discrete semiconductor component or an integrated circuit. IGBT 100 is a three terminal lateral insulated IGBT as illustrated in FIG. 1.

IGBT 100 is a composite substrate comprising a semiconductor region or substrate 110 and a semiconductor epitaxial layer 111 deposited on substrate 110 by epitaxial growth. A buried semiconductor region 115 is partially located in semiconductor epitaxial layer 111 and partially in semiconductor substrate 110. A semiconductor region 120 is located in semiconductor epitaxial layer 111 and above buried semiconductor region 115. A plurality of semiconductor regions 130 are located in semiconductor epitaxial layer 111 and above semiconductor region 120. A plurality of semiconductor regions 140 are located in semiconductor epitaxial layer 111 and generally above semiconductor region 120. Semiconductor substrate 110, semiconductor region 120, and semiconductor regions 130 have a first conductivity type. Buried semiconductor region 115 and semiconductor regions 140 have a second conductivity type. Semiconductor region 120 comprises a plurality of first portions 121, at least a substantial part of each is located under semiconductor regions 130, and a plurality of second portions 122, at least a substantial part of each is located under semiconductor regions 140. In one embodiment, first portions 121 are defined by the formation of semiconductor regions 130 and semiconductor regions 140 and by the doping concentrations within first portions 121 and second portions 122 of semiconductor region 120.

IGBT 100 further includes a sinker region 142. Sinker region 142 in this preferred embodiment has a second conductivity type. Sinker region 142 is disposed within second portions 122 of semiconductor region 120 and semiconductor regions 140 and divides the regions implanted during fabrication (discussed presently) to define the plurality of regions. The division of semiconductor regions 122 and semiconductor regions 140 can be equal or unequal depending on the voltage requirements. Sinker region 142 provides increased punchthrough prevention for IGBT 100. Sinker region 142 is an electrically conductive region having a low resistance path and internally ties semiconductor regions 140 to buried layer 115, thereby forming a double RESURF structure. Sinker region 142 is comprised of a heavily doped impurity region. In this embodiment, sinker region 142 is formed of a heavily doped region having the second conductivity type.

In a particular embodiment of IGBT 100, semiconductor substrate 110 comprises a P-type semiconductor substrate and semiconductor epitaxial layer 111 comprises a P-type epitaxial layer deposited on semiconductor substrate 110. Buried semiconductor region 115 comprises a heavily-doped N-type buried layer. Semiconductor region 120 comprises a P-type semiconductor region, semiconductor regions 130 comprise P-type body regions, and semiconductor regions 140 comprise N-type drift regions. Sinker region 142 comprises a heavily doped N+ region.

First portions 121 of semiconductor region 120 can be an original portion of semiconductor epitaxial layer 111. Second portions 122 of semiconductor region 120 can comprise P-type wells formed in semiconductor epitaxial layer 111. In one embodiment, the doping concentration of first portions 121 is less than the doping concentration of second portions 122. The lower doping concentration of first portions 121 increases the breakdown voltage for a junction 124 between semiconductor region 120 and buried semiconductor region 115, while the higher doping concentration of second portions 122 provides a higher punch-through voltage for semiconductor region 120 between semiconductor regions 140 and buried semiconductor region 115. The higher doping concentration of second portions 122 also provide for a more optimized RESURF action so as to facilitate improved breakdown voltage versus specific on-resistance trade-off.

Buried semiconductor region 115 is formed under a plurality of active areas 145 of IGBT 100. Active areas 145 comprise portions of semiconductor regions 130, semiconductor regions 140, and portions of region 121 formed between semiconductor regions 130 and semiconductor regions 140. In the embodiment illustrated in FIG. 1, buried semiconductor region 115 is continuous under all of active areas 145 of IGBT 100. The introduction of buried semiconductor region 115 prevents direct punch-through from semiconductor regions 130 to semiconductor substrate 110.

IGBT 100 further comprises a first contact terminal, or an emitter 150, and a second contact terminal, or a collector 170. IGBT 100 still further comprises insulating layers 161 positioned on a surface of epitaxial layer 111 in overlying relationship to doped region 120. Generally, insulating layers 161 overlie the surface within (between) regions 130 and oxide region 180. In a preferred embodiment insulating layers 161 are formed of silicon dioxide or silicon nitride grown or deposited on the surface of epitaxial layer 111. A layer of polysilicon is deposited on layers 161 and processed in a well known manner to produce a plurality of contacts which operate as a poly gate terminal 160 and a poly field plate 162. Poly field plate 162 is tied to the cathode to realize high reverse blocking capability.

IGBT 100 still further comprises an oxide region 180, a contact region 190, and a plurality of oxide regions 195. Oxide region 180 defines a voltage blocking region of transistor 100. The length of region 180 determines how much voltage can be blocked by transistor 100. Semiconductor regions 130 serve as body regions, and semiconductor regions 140 serves as drift regions. Emitter 150 has the first conductivity type and serves as a contact to the body region 130. Collector 170 has the first conductivity type, and region 190 has the second conductivity type. Contact region 190 provides for channel formation inside semiconductor region 130 in which it is located, under gate 160. Region 190 acts as the source of the MOS gate 160 and enables MOS gated control. Without the inclusion of region 190, transistor 100 would not operate properly. Regions 195 are optional however, in this particular embodiment of transistor 100, regions 195 isolate emitter 150 and collector 170 from an isolation (ISO) terminal (not shown) of transistor 100.

The reverse bias breakdown voltage of IGBT 100 is governed by the reverse bias breakdown potential between the various regions within IGBT 100. More specifically, when a voltage is applied to a first region having a first conductivity type and a different voltage is applied to a second region having a second conductivity type, a voltage difference is set up between the two regions. The voltage difference is often referred to as a potential difference. A reverse bias breakdown potential is the lowest potential difference that will cause breakdown, meaning the lowest potential difference that will cause a current to flow between the two regions that are reverse biased. A device may cease to function, and may be destroyed, when a voltage greater than the reverse bias breakdown potential is applied between two regions, one of which is externally connected If one of the two regions is grounded, the reverse bias breakdown voltage of the device equals the reverse bias breakdown potential between the two regions. An N-type region may be biased at, for example, 20 volts so that the potential difference between the two regions is 20 volts. If this 20-volt potential difference is the lowest potential difference that will cause a reverse bias current to flow between the regions, the 20-volt potential difference then becomes the breakdown potential between the regions. Finally, the reverse bias breakdown voltage would also be twenty volts because that would be, in this example, the lowest voltage that could be placed on the non-grounded N-type region that would cause the reverse bias breakdown of the device.

N+ sinker 142 allows buried semiconductor region 115 to be internally tied to semiconductor regions 140. During operation, semiconductor regions 140 and buried semiconductor regions 115 deplete second portions 122, meaning that IGBT 100 has a double RESURF structure. As previously stated, N+ sinker 142 provides for increased punchthrough prevention. In the absence of N+ sinker 142, semiconductor region 130 that is connected to emitter 150 will short to semiconductor region 130 that is connected to collector 170, and device 100 will cease to operate. The inclusion of N+ sinker 142, having an opposite conductivity type, prevents such a situation. In addition, N+ sinker 142 provides for the double RESURF operation, and the achievement of a low ON-resistance.

IGBT 100 is essentially a MOSFET in series with a diode. Referring to FIG. 1, the portion of IGBT to the left of a centerline of sinker 142 (indicated by a dashed line 200—200) is a MOSFET structure 210 and to the right of the centerline of sinker 142 is a diode structure 212. Poly field plate 162 is electrically shorted to collector 170 and makes the portion on the right side of the centerline a diode where the fundamental MOSFET type structure is utilized only to realize double RESURF breakdown voltage in the diode side. The presence of gate 160 in MOSFET structure 210, formed left of N+ sinker 142 or the centerline, is essential to achieving high breakdown voltage as it provides a level of relief in the electric field. The same principal on the diode side provides equal breakdown voltage both on a positive as well as a negative side.

If a voltage at collector 170 is raised above a voltage at emitter 150 the result will be a reverse bias across IGBT 100. In an embodiment wherein a voltage at collector 170 is raised above a voltage at emitter 150, a collector-to-emitter reverse blocking voltage for IGBT 100 is a breakdown potential between first portion 121 of semiconductor region 120 and buried semiconductor region 115, or the breakdown potential of junction 124 to the left of the centerline 200. On the other hand, if a voltage at collector 170 is taken below a voltage at emitter 150 the result will be a forward bias across IGBT 100. In an embodiment wherein a voltage at collector 170 is taken below a voltage at emitter 150, a collector-to-emitter forward blocking voltage for IGBT 100 is a breakdown potential between first portion 121 of semiconductor region 120 and buried semiconductor region 115, or the breakdown potential of junction 124 to the right of the centerline 200.

Figure 2:
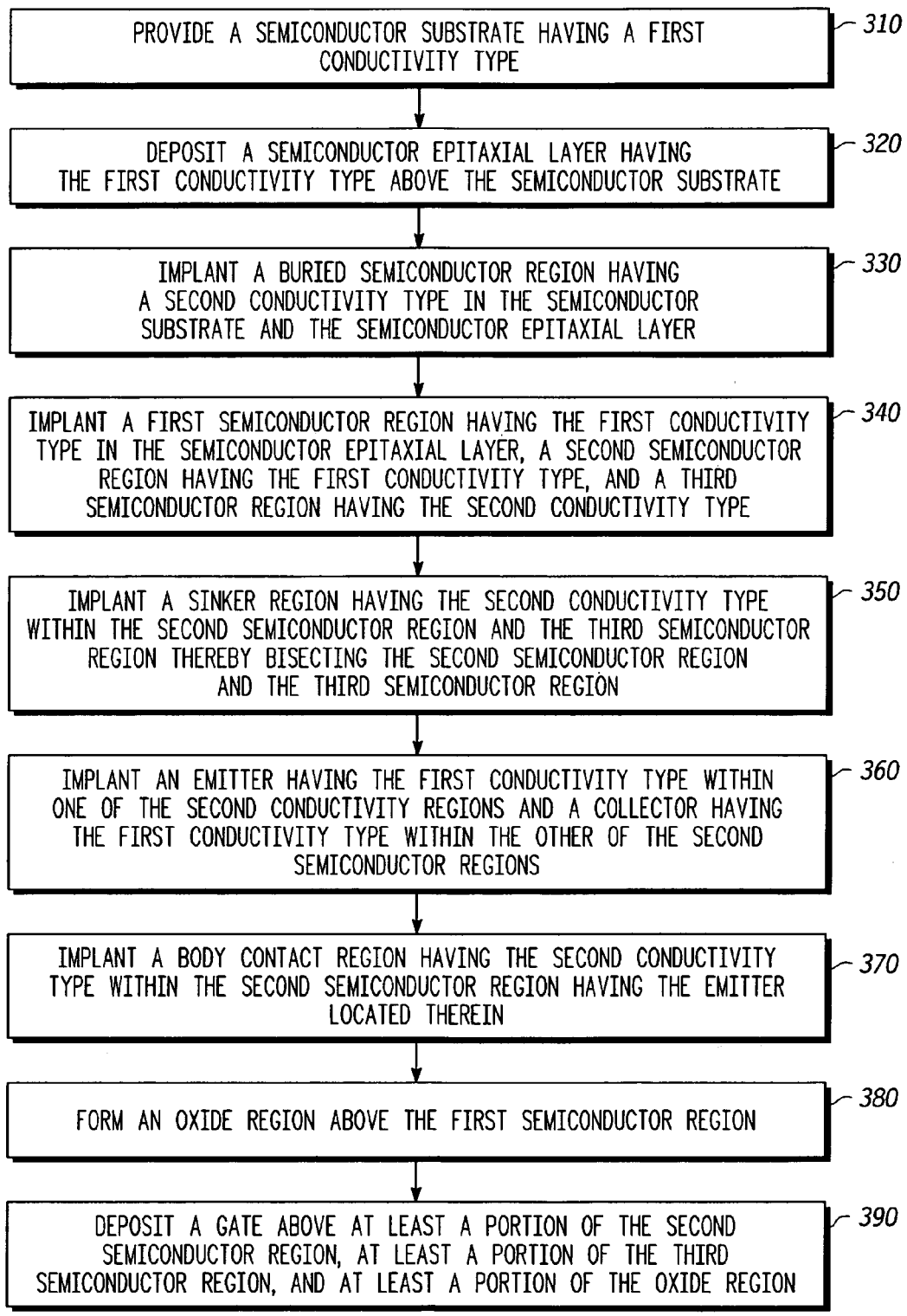
FIG. 2 is a flow diagram illustrating a method of manufacturing a semiconductor component according to an embodiment of the invention.

FIG. 2 is a flow diagram illustrating a method 300 of manufacturing a semiconductor component according to an embodiment of the invention. A first step 310 of method 300 is to provide a semiconductor substrate having a first conductivity type, such as a p-type monocrystalline silicon. As an example, the semiconductor substrate of step 310 can be similar to semiconductor substrate 110 of FIG. 1. While the embodiment described herein are specific to a conductivity type, those skilled in the art will note that n-type doping can substituted for p-type doping, and vice versa, in an alternative embodiment when done throughout the device.

A step 320 of method 300 is to deposit a semiconductor epitaxial layer having the first conductivity type above the semiconductor substrate. As an example, the semiconductor epitaxial layer can be similar to p-type semiconductor epitaxial layer 111 in FIG. 1. Epitaxial layer 111 is deposited to have a thickness of 1.0 to 10.0 microns. Epitaxial layer 111, in a preferred embodiment, is doped with boron and has a doping concentration between ~$1E15/cm^3$ and ~$1E16/cm^3$.

A step 330 of method 300 is to implant a buried semiconductor region having a second conductivity type in the semiconductor epitaxial layer and also, optionally, in the semiconductor substrate. As an example, the buried semiconductor region can be similar to n-type buried semiconductor region 115 in FIG. 1, wherein buried semiconductor region 115 comprises a continuous layer of semiconductor material formed under all of an active area of the semiconductor component by ion implantation. The active area comprises portions of subsequent layers, second semiconductor region and the third semiconductor region. In one embodiment, buried semiconductor region 115 of FIG. 1 is formed by ion implantation of antimony and has a doping concentration between ~$5E18/cm^3$ and ~$5E19/cm^3$.

A step 340 of method 300 is to form by ion implantation a first semiconductor region having the first conductivity type in the semiconductor epitaxial layer, second semiconductor regions having the first conductivity type, and third semiconductor regions having the second conductivity type, formed above the first semiconductor region, wherein the first semiconductor region is located between the third semiconductor region and the buried semiconductor region. As an example, the first semiconductor region may be similar to p-type semiconductor region 120 of FIG. 1 and the second semiconductor regions may be similar to p-type semiconductor regions 130 of FIG. 1. In one embodiment, semiconductor region 120 is formed by ion-implantation of boron, having a doping concentration of between ~$1E15/cm^3$ and ~$5E15/cm^3$. In another embodiment, semiconductor region 120 is formed out of epitaxial layer 111. In one embodiment, semiconductor regions 130 are formed by ion-implantation of boron, having a doping concentration of between ~$1E17/cm^3$ and ~$1E18/cm^3$.

As a further example, the third semiconductor region can be similar to n-type semiconductor regions 140 of FIG. 1. In one embodiment, semiconductor regions 140 are formed by ion implantation of phosphorus, having a doping concentration between ~$1E16/cm^3$ and ~$1E17/cm^3$.

Additional steps may be performed to form portions within the first semiconductor region by differing the doping concentrations. Such portions can be similar to first portion 121 formed under second semiconductor regions 130 of FIG. 1 and second portion 122 formed under third semiconductor regions 140 of FIG. 1. The doping concentration of second portion 122 of first semiconductor region 120 is greater than a doping concentration of first portion 121 of first semiconductor regions 120. The second portion 122 may be formed by ion implantation of boron prior to the formation of semiconductor regions 140. The first portions 121 are typically part of the semiconductor epitaxial layer.

A step 350 of method 300 is to form by high energy chain ion implantation sinker region having the second conductivity type within semiconductor region 120 and semiconductor regions 140. As an example, the sinker region may be similar to n-type sinker region 142 of FIG. 1. In one embodiment, sinker region 142 is formed by high-energy chain ion-implantation of phosphorus, having a doping concentration of between ~1E17/cm$^3$ and ~1E19/cm$^3$.

A step 360 of method 300 is to form an emitter having the first conductivity type within one of the second semiconductor regions and a collector having the first conductivity type within the other of the second semiconductor regions. As an example, the emitter can be similar to p-type emitter 150 of FIG. 1. As a further example, the collector can be similar to p-type collector 170 of FIG. 1. In one embodiment, emitter 150 and collector 170 are formed by boron ion implantation, having a doping concentration between ~1E19/cm$^3$ and ~1E20/cm$^3$.

A step 370 of method 300 is to form a contact region having the second conductivity type within the second semiconductor region having the emitter located therein. As an example, the contact region can be similar to n-type contact region 190 of FIG. 1. In one embodiment, contact region 190 is formed by phosphorus and/or arsenic ion implantation, having a doping concentration between ~1E19/cm$^3$ and ~1E20/cm$^3$.

A step 380 of method 500 is to form a plurality of oxide regions above the first semiconductor region either by thermal oxidation or silicon trench etch and fill. As an example, one of the plurality of oxide regions can be similar to oxide region 180 in FIG. 1. Additional oxide regions can be similar to oxide regions 195 in FIG. 1. A step 390 of method 300 is to form a first gate above at least a portion of one of the second semiconductor regions and at least a portion of one of the third semiconductor regions. As an example, the gate can be similar to gate 160 of FIG. 1. A poly field plate is next formed above first semiconductor region, at least a portion of one of the second semiconductor regions, at least a portion of one of the third semiconductor regions, and at least a portion of the oxide region. As an example, the poly field plate can be similar to poly field plate 162 of FIG. 1.

IGBT 100 provides bidirectional blocking capability with high breakdown voltage in thin-epitaxy based smart power technology that can reduce the size of several device modules that connect to interfaces requiring blocking capability in both directions. No additional masks are required during fabrication. IGBT 100 captures a broad concept of an isolated single RESURF IGBT, a double RESURF IGBT, and a FRESURF IGBT in state-of-the-art smart power technologies.

Accordingly, provided is a semiconductor component comprising: a lateral insulated gate bipolar transistor (IGBT) comprising: a semiconductor substrate having a first conductivity type; a buried semiconductor region having a second conductivity type and located above the semiconductor substrate; a plurality of first semiconductor regions having the first conductivity type and located above the buried semiconductor region; a plurality of second semiconductor regions having the first conductivity type and located above the first semiconductor region; a plurality of third semiconductor regions having the second conductivity type and located above the first semiconductor region; a sinker region having the second conductivity type and disposed between the plurality of first semiconductor regions and the plurality of third semiconductor regions, wherein the sinker region electrically ties the buried semiconductor region and the plurality of third semiconductor regions; an emitter having the first conductivity type and disposed in one of the second semiconductor regions; a collector having the first conductivity type and disposed in the other of the second semiconductor regions; and a poly field plate formed above a portion of the second body region having the collector formed therein and a portion of one of the plurality of third semiconductor regions, wherein the third semiconductor region and the buried semiconductor region deplete the plurality of first semiconductor regions in response to a reverse bias potential applied between the collector and the emitter. Each of the plurality of first semiconductor regions has a first portion and a second portion and a doping concentration of each of the first portions is less than a doping concentration of each of the second portions. The second and third semiconductor regions form a plurality of active areas for the IGBT. The buried semiconductor region is continuous under all of the plurality of first semiconductor regions. The poly field plate is electrically tied to a same potential as the collector and provides high reverse blocking capability. The first conductivity type is P-type and the second conductivity type is N-type.

In addition, provided is a semiconductor component comprising an IGBT comprising: a semiconductor substrate having a surface; a semiconductor epitaxial layer above the surface of the semiconductor substrate; an N-type buried semiconductor region in the semiconductor epitaxial layer; a plurality of P-type semiconductor regions in the semiconductor epitaxial layer and above the N-type buried semiconductor region; a plurality of P-type body regions in the semiconductor epitaxial layer and above the plurality of P-type semiconductor regions; a plurality of N-type drift regions in the semiconductor epitaxial layer and above the plurality of P-type semiconductor regions; an N-type sinker region disposed between the plurality of P-type semiconductor regions and the plurality of P-type body regions, wherein the N-type sinker region electrically ties the N-type buried semiconductor region and the plurality of N-type drift regions; a P-type emitter region disposed in one of the P-type body regions; a P-type collector region disposed in the other of the P-type body regions; and a poly field plate formed above a portion of the P-type body region having the collector formed therein and a portion of the N-type drift region, wherein the plurality of P-type semiconductor regions are configured to be depleted in response to a reverse bias potential applied across the IGBT. Each of the plurality of P-type semiconductor regions in the semiconductor epitaxial layer and above the N-type buried semiconductor region has a first portion and a second portion and a doping concentration of each of the first portions is less than a doping concentration of each of the second portions. The plurality of P-type body regions and the plurality of N-type drift regions form a plurality of active areas for the IGBT. Portions of the N-type buried semiconductor region are continuous under all of the plurality of first semiconductor regions. The poly field plate is electrically tied to a same potential as the P-type collector and provides high reverse blocking capability.

Finally, provided is a method of manufacturing a semiconductor component comprising: providing a composite substrate comprising a semiconductor epitaxial layer above a semiconductor substrate, the composite substrate having a first conductivity type; forming a buried semiconductor region in the epitaxial layer, having the first conductivity type; forming a first semiconductor region in the epitaxial layer, having the first conductivity type and located above the buried semiconductor region; forming a plurality of second semiconductor regions in the epitaxial layer, having the first conductivity type and located above the first semiconductor region; forming a third semiconductor region in the epitaxial layer, having the second conductivity type and located above the first semiconductor region; forming a sinker region disposed in the first semiconductor region and the third semiconductor region, thereby defining a plurality of first semiconductor regions and a plurality of third semiconductor regions; disposing an emitter having the first conductivity type in one of the second semiconductor regions in the epitaxial layer; disposing a collector having the first conductivity type in the other of the second semiconductor regions in the epitaxial layer; and forming a poly field plate above a portion of the third semiconductor region having the collector formed therein and a portion of the third semiconductor region, wherein the plurality of third semiconductor regions and the buried semiconductor region deplete the plurality of first semiconductor regions in response to a reverse bias potential applied between the plurality of second semiconductor regions and the plurality of third semiconductor regions. The first conductivity type is P-type and the second conductivity type is N-type. The buried semiconductor region is formed as a continuous layer. The method may further include the step of doping each of the first semiconductor regions to define a first portion and a second portion, at least a substantial part of each of the first portions is formed under one of the plurality of second semiconductor regions in the epitaxial layer, at least a substantial part of each of the second portions is formed under one of the plurality of third semiconductor regions in the epitaxial layer, and a doping concentration of each of the first portions is less than a doping concentration of each of the second portions. The poly field plate is electrically tied to collector and provides high reverse blocking capability.

While a plurality of exemplary embodiments have been presented in the foregoing detailed description, it should be appreciated that additional variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

What is claimed is:

1. A method of manufacturing a semiconductor component comprising:
    providing a composite substrate comprising a semiconductor epitaxial layer above a semiconductor substrate, the composite substrate having a first conductivity type;
    forming a buried semiconductor region in the epitaxial layer, having a second conductivity type;
    forming a first semiconductor region in the epitaxial layer, having the first conductivity type and located above the buried semiconductor region;
    forming a plurality of second semiconductor regions in the epitaxial layer, having the first conductivity type and located above the first semiconductor region;
    forming a third semiconductor region in the epitaxial layer, having the second conductivity type and located above the first semiconductor region;
    forming a sinker region disposed in the first semiconductor region and the third semiconductor region, thereby defining a plurality of first semiconductor regions and a plurality of third semiconductor regions;
    disposing an emitter having the first conductivity type in one of the second semiconductor regions in the epitaxial layer;
    disposing a collector having the first conductivity type in one of the other of the second semiconductor regions in the epitaxial layer; and
    forming a poly field plate above a portion of the second semiconductor region having the collector formed therein and a portion of the third semiconductor region,
    wherein the plurality of third semiconductor regions and the buried semiconductor region deplete the plurality of first conductor regions in response to a reverse bias potential applied between the plurality of second semiconductor regions and the plurality of third semiconductor regions.

2. A method of manufacturing a semiconductor component as claimed in claim 1 wherein the first conductivity type is P-type and the second conductivity type is N-type.

3. A method of manufacturing a semiconductor component as claimed in claim 1 wherein forming the buried semiconductor region is formed as a continuous layer.

4. A method of manufacturing a semiconductor component as claimed in claim 1 further including the step of doping each of the first semiconductor regions to define a first portion and a second portion, at least a substantial part of each of the first portions is formed under one of the plurality of second semiconductor regions in the epitaxial layer, at least a substantial part of each of the second portions is formed under one of the plurality of third semiconductor regions in the epitaxial layer, and a doping concentration of each of the first portions is less than a doping concentration of each of the second portions.

5. A method of manufacturing a semiconductor component as claimed in claim 1 wherein the poly field plate is electrically tied to collector and provides high reverse blocking capability.

* * * * *